(12) United States Patent
Chi et al.

(10) Patent No.: US 7,519,091 B2
(45) Date of Patent: Apr. 14, 2009

(54) ALL-OPTICAL 2R REGENERATOR USING SELF-SEEDED LASER DIODE

(75) Inventors: Sien Chi, Hsinchu (TW); Chien-Chung Lee, Hualien County (TW); Hung-Chang Chien, Tainan (TW)

(73) Assignee: National Chiao Tung University, Hsinchu (TW)

( * ) Notice: Subject to any disclaimer, the term of this patent is extended or adjusted under 35 U.S.C. 154(b) by 432 days.

(21) Appl. No.: 11/440,462

(22) Filed: May 25, 2006

(65) Prior Publication Data
US 2007/0274354 A1    Nov. 29, 2007

(51) Int. Cl.
*H01S 3/098* (2006.01)

(52) U.S. Cl. .......................................... 372/18; 372/19
(58) Field of Classification Search ................... 372/18, 372/19
See application file for complete search history.

(56) References Cited
U.S. PATENT DOCUMENTS

| | | | |
|---|---|---|---|
| 6,967,984 B2 * | 11/2005 | Chiaretti | 372/92 |
| 2002/0196824 A1 * | 12/2002 | Althaus et al. | 372/36 |
| 2005/0123012 A1 * | 6/2005 | Hayamizu et al. | 372/38.01 |

* cited by examiner

*Primary Examiner*—Armando Rodriguez
(74) *Attorney, Agent, or Firm*—Troxell Law Office, PLLC

(57) ABSTRACT

The present invention is a self-seeded laser diode. The laser diode obtains a gain by itself without using expansive erbium-doped fiber amplifiers. Hence, the cost is reduced and the system is simplified.

12 Claims, 5 Drawing Sheets

ALL-OPTICAL 2R REGENERATOR USING SELF-SEEDED LASER DIODE

FIELD OF THE INVENTION

The present invention relates to a laser diode; more particularly, relates to an all-optical 2R regenerator simultaneously reamplifying and reshaping a distorted signal.

DESCRIPTION OF THE RELATED ARTS

A first prior art is proclaimed in U.S. Pat. No. 6,608,854, "Method, device and system for waveform shaping of signal light". The first prior art provides a method, a device and a system for waveform shaping of signal light, where the device comprises a distributed feedback (DFB) laser diode having a stop band defined as a range of wavelengths allowing laser oscillation; and a drive circuit supplying a drive current to the DFB laser oscillating at a first wavelength included in the stop band. The signal light has a second wavelength not included in the stop band and is inputted into the DFB laser. A signal is injected into a side mode of a laser diode with a greater energy than the threshold of the laser diode to lock the side mode; and waveform is shaped through a thresholding effect of an injection-locked laser diode.

A second prior art is proclaimed in U.S. Pat. No. 6,515,793, "Optical waveform shaper". The second prior art is an optical waveform shaper, where an optical modulator and a saturation absorber is used to shape waveform and enhance extinction ratio while accompanying with wavelength convert.

A third prior art, "All-optical regeneration using a side-mode injection-locked semiconductor laser", is revealed at September, 2003 by A. Kuramoto and S. Yamashita. In the paper, an all-optical regeneration is provided where one or two side-mode injection-locked semiconductor laser diodes are used so that a relaxation oscillation is effectively reduced.

Although the second prior art uses an optical modulator and a saturation absorber to reshape waveform and enhance extinction ratio while accompanying with wavelength convert, the optical modulator and the saturation absorber are expansive and do not obtain gain so that an erbium-doped fiber amplifier is used to compensate the gain. The first and the third prior arts have a signal with great energy and an outside continuous light source injected into two side modes of a laser diode to lock the side mode so that waveform is shaped by the thresholding effect of the injection-locked laser diode; and the relaxation oscillation frequency of the injection-locked laser diode and the operation speed are enhanced by the continuously injected outside laser. But, because the required amount of the injected power is great and a power loss is accompanied on shaping waveform, an erbium-doped fiber amplifier is use for a compensation, where a cost for the whole system is thus increased. And the system become complex by using the outside continuous laser. Hence, the prior arts do not fulfill users' requests on actual use.

SUMMARY OF THE INVENTION

The main purpose of the present invention is to provide an all-optical 2R regenerator simultaneously reamplifying and reshaping a distorted signal with a reduced cost and a simplified system.

To achieve the above purpose, the present invention is an all-optical 2R regenerator using a self-seeded laser diode, comprising a laser diode, a lens, a reflective component and a fiber pigtail, wherein the laser diode comprises a main mode and aside mode and is a Fabry-Perot laser diode the lens is a non-sphere lens; the reflective component is a wavelength selector selecting a wavelength of light to be reflected, and is a fiber grating directly sealed in the all-optical 2R regenerator; a feedback cavity is formed between the reflective component and the laser diode; and the length of the feedback cavity is shorter than 1 centimeter. Besides, the all-optical 2R regenerator generates a regenerated signal by steps of: generating a self-seeded light from the reflective component; locking the side mode of the laser diode with the self-seeded light; injecting a distorted signal to the main mode of the laser diode, where the distorted signal has an energy greater than a threshold energy of the laser diode; and, outputting the regenerated signal. Accordingly, a novel all-optical 2R regenerator using a self-seeded laser diode is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is a structural view showing a preferred embodiment according to the present invention;

DESCRIPTION OF THE PREFERRED EMBODIMENT

The following description of the preferred embodiment is provided to understand the features and the structures of the present invention.

Figure 1:
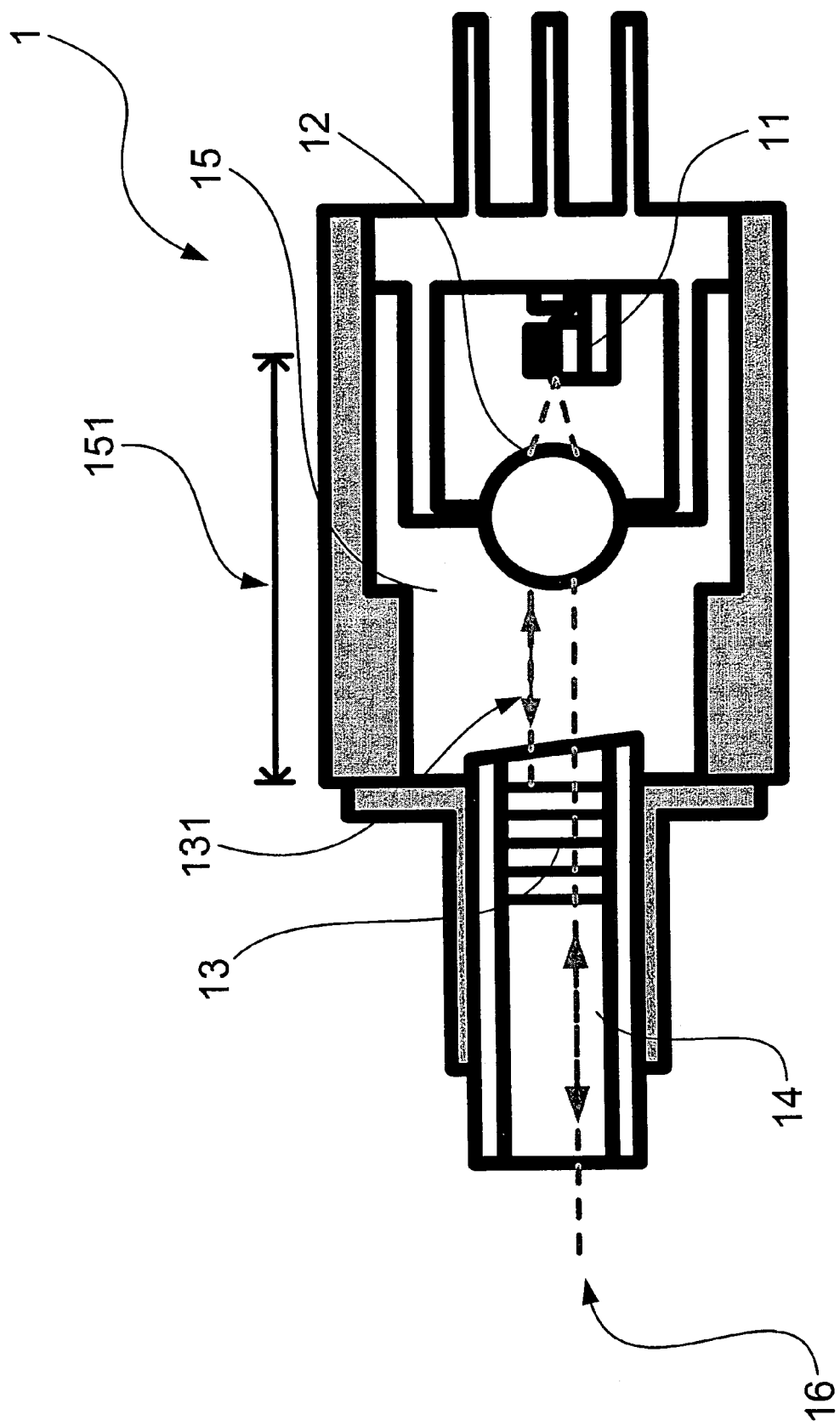

Please refer to FIG. 1 which is a structural view showing a preferred embodiment according to the present invention. As shown in the figure, the present invention is an all-optical 2R regenerator 1 using a self-seeded laser diode, comprising a laser diode 11, a lens 12, a reflective component 13 and a fiber pigtail 14.

Therein, the laser diode 11 comprises a main mode and a side mode and is a Fabry-Perot laser diode; the lens is a non-sphere lens; the reflective component 13 is a wavelength selector selecting a wavelength for the reflective component 13 to reflect, is a fiber grating, and is directly sealed in the all-optical 2R regenerator 1 forming a feedback cavity 15 between itself and the laser diode 11; the length 151 of the feedback cavity 15 is shorter than 1 centimeter (cm); and, the fiber grating is etched at a length shorter than 1 cm.

Figure 2:
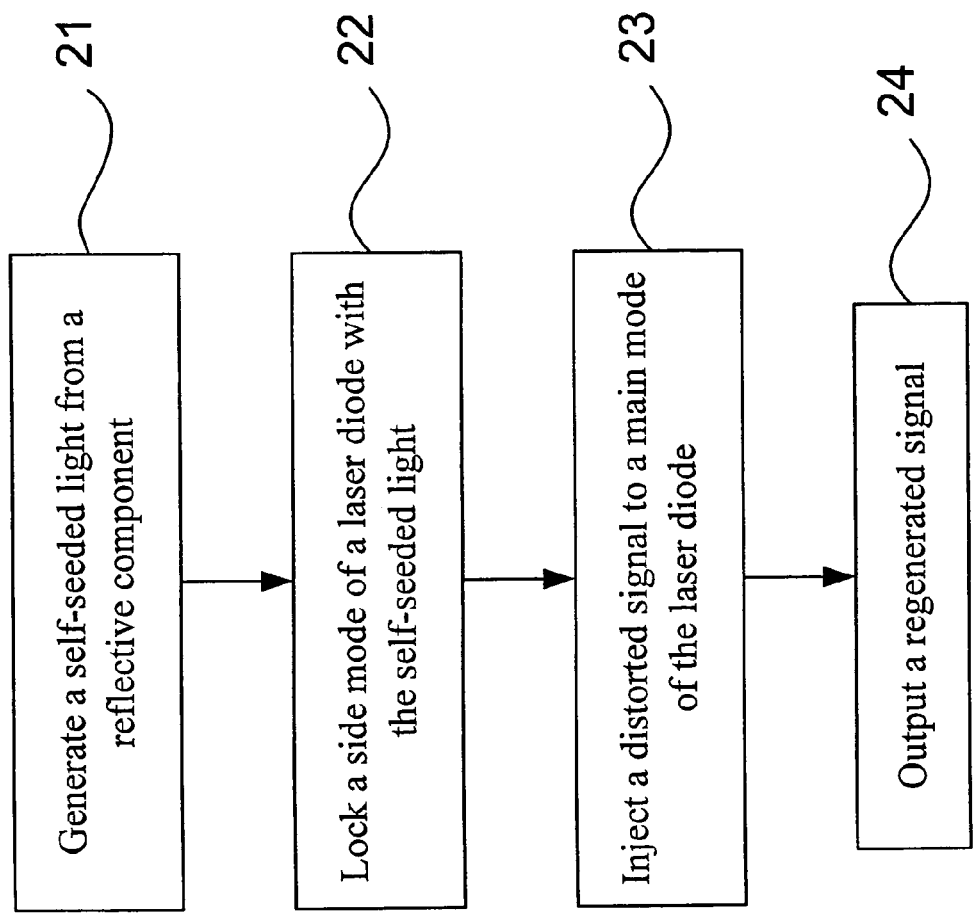
FIG. 2 is a view showing the flowchart of generating the regenerated signal.

Please further refer to FIG. 2, which is a view showing the flow chart of generating the regenerated signal. As shown in the figure, generating a regenerated signal according to the present invention comprises the following steps:

(a) Generate a self-seeded light from a reflective component 21: A self-seeded light 131 is generated from the reflective component 13 to be reflected, where the wavelength of the self-seeded light 131 is determined through the reflective component 13.

(b) Lock a side mode of a laser diode with the self-seeded light 22: When no signal is injected into the laser diode 11, the self-seeded light locks at the side mode of the laser diode 11. And when the side mode suppression ratio (SMSR) of the side mode is greater than 40 dB, a single-mode light is outputted.

(c) Inject a distorted signal to a main mode of the laser diode 23: A distorted signal 16 is injected into a main mode of the laser diode 11, where the distorted signal 16 has an energy greater than a threshold energy of the laser diode 11 so that the laser diode 11 is locked at a frequency of the distorted signal 16 to steadily output a power. When the energy of the distorted signal 16 is smaller than the threshold energy of the laser diode 11, the distorted signal 16 is greatly weakened. On the contrary, when the distorted signal 16 has enough energy to lock the laser diode 11, the thus obtained threshold value of the laser diode 11 restrains noises of the distorted signal 16 between zero and one; and a rising time and a falling time of the distorted signal 16 are shortened either. The threshold energy is an energy just enough to lock the main mode or the side mode of the laser diode 11; or, in another word, the threshold energy is the smallest amount of energy to lock the main mode or the side mode. The distorted signal 16 is injected at a position in the gain spectrum of the laser diode 11 where the greatest gain is obtained; that is, a position within the main mode. And, because the threshold energy is the smallest amount by definition, the greatest gain is obtained.

(d) Output a regenerated signal 24: Finally, a regenerated signal 17 is outputted, where the regenerated signal 17 is obtained by reamplifying and reshaping the distorted signal 16 with the all-optical 2R regenerator 1 and the regenerated signal 16 is outputted through an optical filter 17.

Figure 3A:
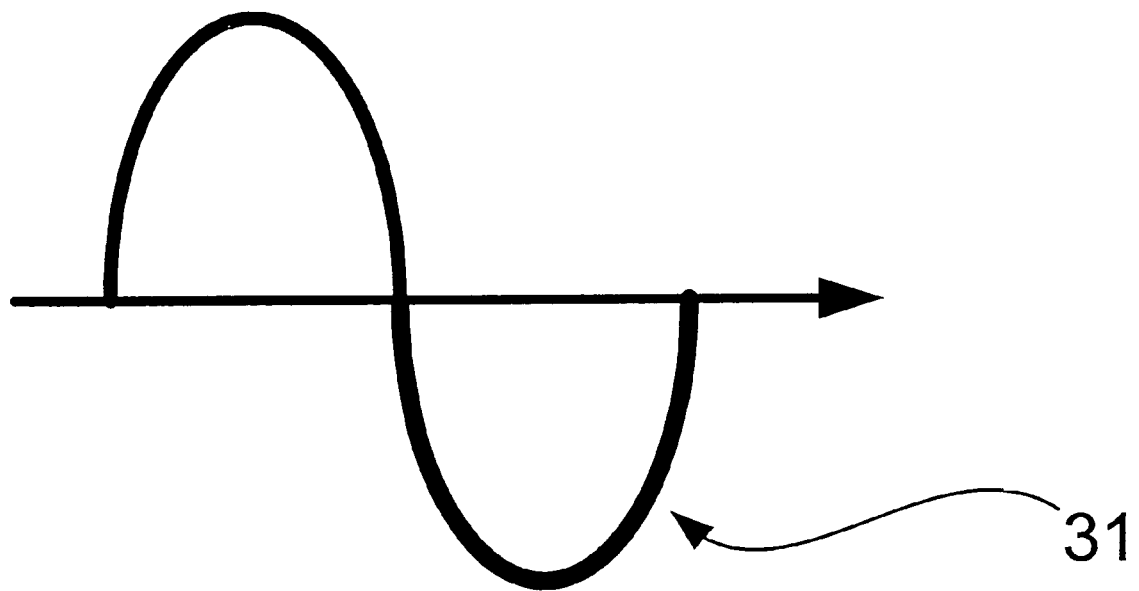
FIG. 3A is a view showing the waveform of the distorted signal.
Figure 3B:
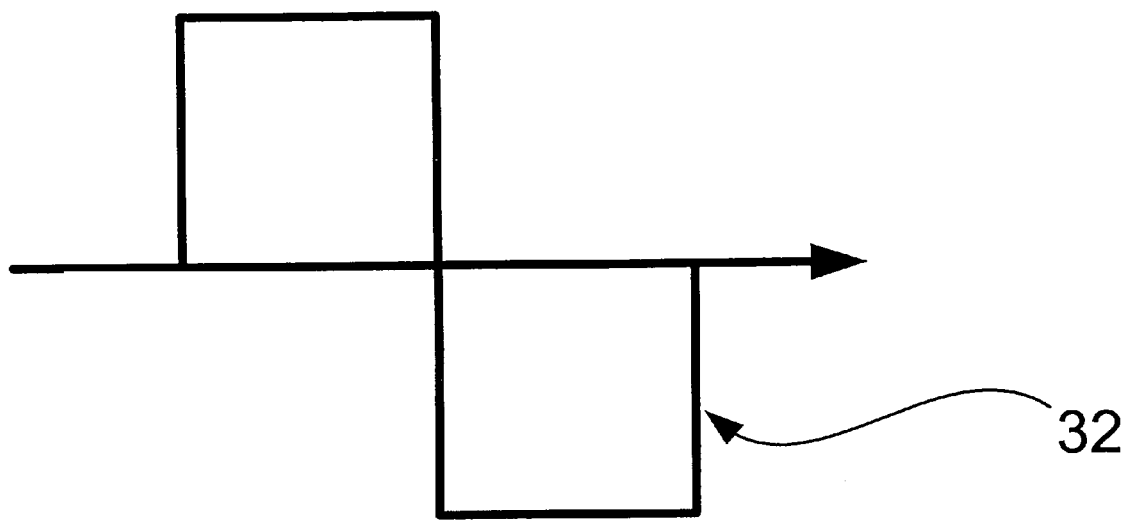
FIG. 3B is a view showing the waveform of the regenerated signal.

Please refer to FIG. 3A and FIG. 3B, which are views showing waveforms of the distorted signal and the regenerated signal. As shown in the figures, a first waveform of a distorted signal 31 has noises between zero and one before being processed by an all-optical 2R regenerator according to the present invention. After being reamplified and reshaped with the all-optical 2R regenerator, noises between zero and one in the first waveform of the distorted signal 31 is greatly eliminated, which is shown as the second waveform of the distorted signal 32. And the rising time and the falling time of the distorted signal are shortened.

Figure 4:
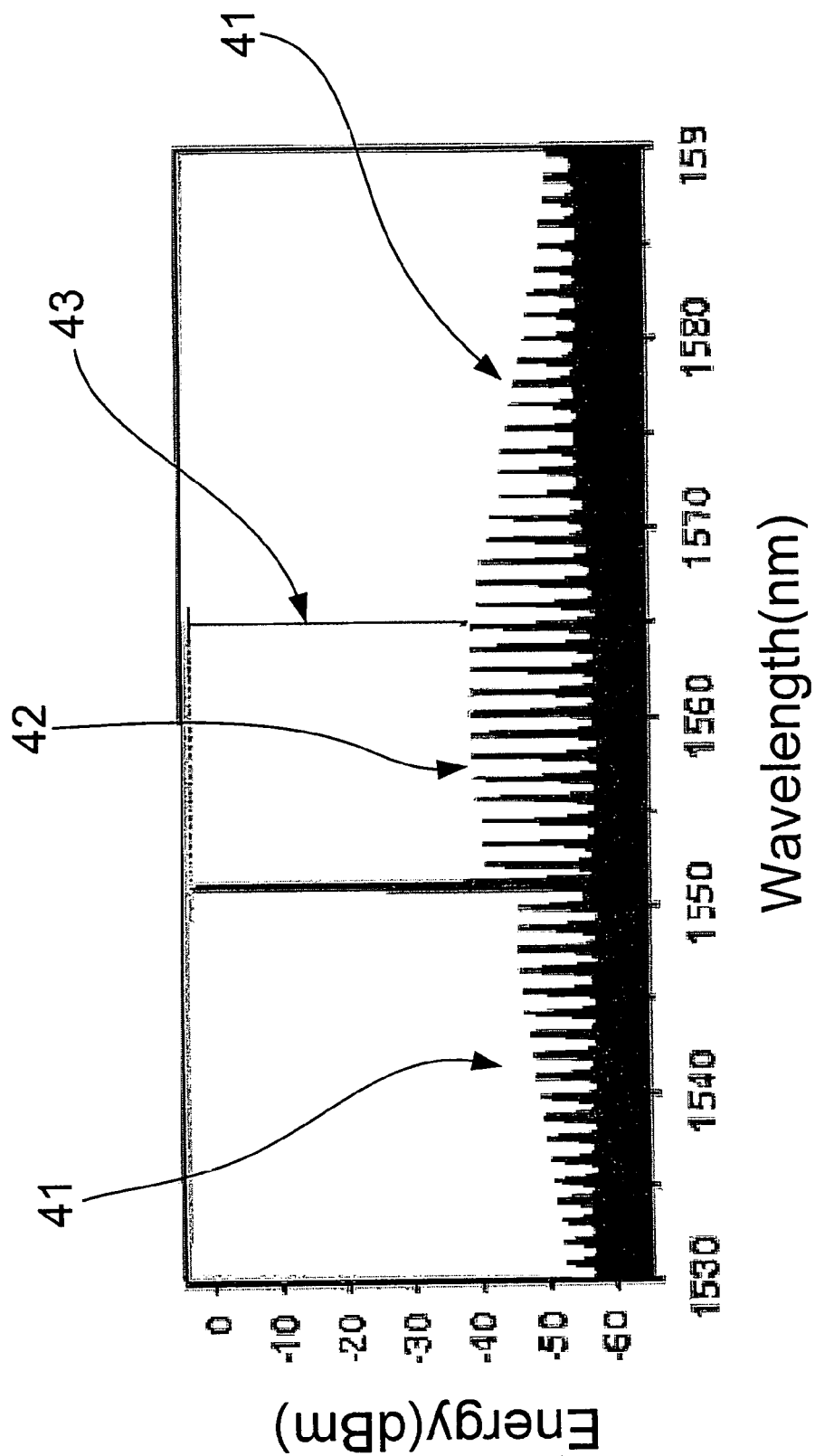
FIG. 4 is a view showing the gain spectrum of the laser diode.

Please refer to FIG. 4, which is a view showing the gain spectrum of the laser diode. As shown in the figure, a wavelength of a self-seeded light shorter than 1550 nanometer (nm) is injected into a side mode 41 of a laser diode at a direction having a shorter wavelength. The side mode 41 is then steadily locked to obtain an SMSR of the side mode 43 around the main mode 42 as high as 40 dB. Hence, by steadily injecting the wavelength of the self-seeded light into the side mode 41 of the laser diode, an oscillating frequency of the laser diode is increased so that the all-optical 2R regenerator is run easily under a high speed by using the laser diode. Therein, the peak in the whole gain spectrum is located at the main mode 42. A declination from the peak is the side mode 41. That is, the main mode 42 has a higher position than the side mode 41; and the main mode 41 is the position where a greatest laser energy or gain is obtained under a free emission.

To sum up, the present invention is an all-optical 2R regenerator using a self-seeded laser diode, where the present invention has a build-in reflective component of fiber grating to obtain a gain and a feed back cavity between the reflective component; and a laser diode is very short. Hence, the all-optical 2R regenerator according to the present invention obtains a gain and a self-seeded light to be reflected and further reamplifies and reshapes a signal by simply using a cheap self-seeded laser diode, where the cost is reduced and the system is simplified.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An all-optical regenerator using a self-seeded laser diode, comprising:
    a laser diode, said laser diode comprising at least one side mode and a main mode; a fiber pigtail;
    a lens, said lens coupling light from said laser diode to said fiber pigtail and a reflective component, said reflective component reflecting a light of a certain wavelength,
    wherein said all-optical regenerator generates a regenerated signal by steps of:
    (a) generating a self-seeded light from said reflective component to be reflected;
    (b) locking said side mode of said laser diode with said self-seeded light;
    (c) injecting a distorted signal to said main mode of said laser diode; and
    (d) outputting said regenerated signal.

2. The regenerator according to claim 1, wherein a feedback cavity is obtained between said reflective component and said laser diode.

3. The regenerator according to claim 2, wherein said feedback cavity has a length shorter than 1 centimeter (cm).

4. The regenerator according to claim 1, wherein said laser diode is a Fabry-Perot laser diode.

5. The regenerator according to claim 1, wherein said reflective component is a wavelength selector selecting a certain wavelength of light to be reflected.

6. The regenerator according to claim 1, wherein said reflective component is a fiber grating.

7. The regenerator according to claim 6, wherein said fiber grating is etched at a length shorter than 1 cm.

8. The regenerator according to claim 1, wherein said self-seeded light has a wavelength obtained through a selection of said reflective component.

9. The regenerator according to claim 1, wherein said distorted signal has an energy greater than a threshold energy of said laser diode, said laser diode comprising said main mode and said side mode.

10. The regenerator according to claim 9, wherein said threshold energy is an energy to lock a mode of said laser diode; and wherein said mode is selected from a group consisting of said main mode and said side mode.

11. The regenerator according to claim 1, wherein said main mode is a highest position in a gain spectrum of said laser diode freely emitted.

12. The regenerator according to claim 1, wherein said regenerated signal is filtered by an optical filter.

* * * * *